United States Patent
Feig et al.

(10) Patent No.: US 11,442,891 B2
(45) Date of Patent: Sep. 13, 2022

(54) HOLOGRAPHIC QUANTUM DYNAMICS SIMULATION

(71) Applicant: Quantinuum LLC, Broomfield, CO (US)

(72) Inventors: Michael Feig, Broomfield, CO (US); Andrew C. Potter, Broomfield, CO (US)

(73) Assignee: Quantinuum LLC, Broomfield, CO (US)

( * ) Notice: Subject to any disclaimer, the term of this patent is extended or adjusted under 35 U.S.C. 154(b) by 371 days.

(21) Appl. No.: 16/705,727

(22) Filed: Dec. 6, 2019

(65) Prior Publication Data
US 2021/0173810 A1    Jun. 10, 2021

(51) Int. Cl.
| | |
|---|---|
| G06F 15/80 | (2006.01) |
| G06N 10/00 | (2022.01) |
| G06F 15/82 | (2006.01) |
| G06F 30/20 | (2020.01) |
| G06N 10/20 | (2022.01) |
| G06N 10/40 | (2022.01) |
| G06N 10/60 | (2022.01) |

(52) U.S. Cl.
CPC .............. *G06F 15/82* (2013.01); *G06F 30/20* (2020.01); *G06N 10/00* (2019.01); *G06N 10/20* (2022.01); *G06N 10/40* (2022.01); *G06N 10/60* (2022.01)

(58) Field of Classification Search
CPC ........ G06N 10/20; G06N 10/00; G06N 10/40; G06N 10/60; G06N 10/70; G06F 15/82; G06F 30/327; G06F 17/5009; G06F 15/76; G06F 30/33; G06F 8/443; G06F 30/367; G06F 9/3001; G06F 30/20; G06F 17/5045; B82Y 10/00
See application file for complete search history.

(56) References Cited

U.S. PATENT DOCUMENTS

| | | | |
|---|---|---|---|
| 10,192,168 B2 * | 1/2019 | Rigetti | ............... G06F 13/4068 |
| 10,733,524 B1 * | 8/2020 | Feig | ...................... G06N 10/00 |

(Continued)

FOREIGN PATENT DOCUMENTS

JP    2020-513610 A    5/2020

OTHER PUBLICATIONS

Dynamic quantum state holography. K. Eickhoff, S. Kerbstadt, T. Bayer, and M. Wollenh (Year: 2020).*

(Continued)

*Primary Examiner* — Vibol Tan
(74) *Attorney, Agent, or Firm* — Alston & Bird LLP (57) ABSTRACT

A quantum computer controller receives a quantum circuit comprising circuit slices. The first slice comprises a past causal cone of a first system qubit wire at a fully evolved level of the circuit. An i-th slice contains all gates that are within a past causal cone of a system qubit wire that reaches the fully evolved level in slice i that are not in the past causal cone of a system qubit wire that reaches the fully evolved level in slice i–j. The controller causes execution of the i-th slice using the physical qubits; causes a physical qubit that was evolved along a system qubit wire to the fully evolved level via execution of the i-th slice to be reinitialized and reintroduced onto a system qubit wire at a base level of the i+m-th slice; and causes the quantum computer to use the physical qubit to execute the i+m-th slice.

20 Claims, 7 Drawing Sheets

(56) References Cited

U.S. PATENT DOCUMENTS 10,984,152 B2 * 4/2021 Rubin ............... G06F 9/455
2019/0266512 A1 8/2019 Shen et al.

OTHER PUBLICATIONS

Holographic dynamics simulations with a trapped ion quantum computer. Eli Chertkov et al. (Year: 2021).*
Holographic quantum algorithms for simulating correlated spin systems. Michael Foss-Feig et al. (Year: 2021).*
Using Quantum Computers for Quantum Simulation. Katherine L. Brown et al. (Year: 2010).*
Alexandru Paler et al: "Wire Recycling for Quantum Circuit Optimization", arxiv.org, Cornell University Library, 201 Olin Library Cornell University Ithaca, NY 14853, Sep. 3, 2016, XP080967612.
European Search Report and Search Opinion Received for EP Application No. 20209625.1, dated May 3, 2021, 9 pages.
Haozhen Situ et al: "Adversarial training of quantum Born machine", arxiv.org, Cornell University Library, 201 Olin Library Cornell University Ithaca, NY 14853, Jul. 3, 2018, XP081243610.
Jin-Guo Liu et al: "Variational Quantum Eigensolver with Fewer Qubits", arxiv.org, Cornell University Library, 201 Olin Library Cornell University Ithaca, NY 14853, Feb. 7, 2019, XP081463740.
Michael Foss-Feig et al: "Holographic quantum algorithms for simulating correlated spin systems", arxiv.org, Cornell University Library, 201 Olin Library Cornell University Ithaca, NY 14853, May 6, 2020, XP081669872.
English Translation of JP Office Action, including Search Report, dated Dec. 3, 2021 for JP Application No. 2020201918, 20 pages.
IN Office Action dated Dec. 14, 2021 for IN Application No. 202014051600, 7 pages.
JP Office Action, including Search Report, dated Dec. 3, 2021 for JP Application No. 2020201918, 15 pages.
Shehab, Omar, et al., "Noise reduction using past causal cones in variational quantum algorithms", Jun. 12, 2019, 19 pages, v. 3, retrieved from the Internet at: https://arxiv.org/pdf/1906.00476.pdf, Cornell University, US.
Exam Report No. 1 issued in Australian Application No. 2020270516 dated Aug. 30, 2021, 3 pages.
Bravui et al., Fermionic Quantum Computation, 2002 [online] [retrieved Mar. 12, 2020] retrieved from the Internet URL: https://arxiv.org/pdf/quant-ph/0003137.pdf, 18 pages.
Brydges et al., Probing Entanglement Entropy Via Randomized Measurements, 2019 [online] [retrieved Mar. 12, 2020] retrieved from the Internet URL: https://arxiv.org/abs/1806.05747, 26 pages.
Bultinck et al., Fermionic Matrix Product States and One-Dimensional Topological Phases, 2017 [online] [retrieved Mar. 12, 2020] retrieved from the Internet URL: https://arxiv.org/pdf/1610.07849.pdf, 24 pages.
Huggins et al., Towards Quantum Machine Learning with Tensor Networks, 2019 [online] [retrieved Mar. 12, 2020] retrieved from the Internet URL: https://arxiv.org/abs/1803.11537, 12 pages.
Isaac H. Kim, Holographic Quantum Simulation, 2017, [online] [retrieved Mar. 12, 2020] retrieved from the Internet URL: https://arxiv.org/abs/1702.02093, 7 pages.
Isaac H. Kim, Noise-Resilient Preparation of Quantum Many-Body Ground States, 2017 [online] [retrieved Mar. 12, 2020] retrieved from the Internet URL: https://arxiv.org/abs/1703.00032, 23, pages.
Islam et al., Measuring Entanglement Entropy Through the Interference of Quantum Many-Body Twins, 2015 [online] [retrieved Mar. 12, 2020] retrieved from the Internet URL: https://arxiv.org/pdf/1509.01160.pdf. 14 pages.
Schon et al., Sequential Generation of Entangled Multi-Qubit States, 2005 [online] [retrieved Mar. 12, 2020] retrieved from the Internet URL: https://arxiv.org/abs/quant-ph/0501096, 5 pages.
Ulrich Schollwock, The Density-Matrix Renormalization Group in the Age of Matrix Product States, 2010 [online] [retrieved Mar. 12, 2020] retrieved from the Internet URL: https://arxiv.org/abs/1008.3477, 188 pages.
AU Notice of Allowance dated Apr. 1, 2022 for AU Application No. 2020270516, 3 pages.
CA Office Action dated Apr. 25, 2022 for CA Application No. 3100864, 5 pages.
English Translation of JP Office Action dated Jul. 1, 2022 for JP Application No. 2020201918, 3 pages.
JP Office Action dated Jul. 1, 2022 for JP Application No. 2020201918, 2 pages.

* cited by examiner

HOLOGRAPHIC QUANTUM DYNAMICS SIMULATION

TECHNICAL FIELD

Various embodiments relate to the execution of a quantum circuit by a quantum computer. For example, various embodiments relate to the execution of a quantum circuit by a quantum computer with efficient qubit usage.

BACKGROUND

Near-term quantum computing hardware will have access to only a limited number (10's to 100's) of quantum bits (qubits), and will also be strongly limited by noise and gate errors. The relatively small number of noisy qubits makes it difficult to effectively solve complex problems that are very challenging to solve using classical computing means. Through applied effort, ingenuity, and innovation many deficiencies of such systems have been solved by developing solutions that are structured in accordance with the embodiments of the present invention, many examples of which are described in detail herein.

BRIEF SUMMARY OF EXAMPLE EMBODIMENTS

Various embodiments provide methods, quantum computers, computing entities (e.g., classical computing entities), systems, computer program products, and/or the like. According to one aspect, a quantum computer may execute a quantum circuit via efficient use of the physical qubits of the quantum computer. In an example embodiment, a controller of a quantum computer receives a quantum circuit comprising a plurality of circuit slices. The quantum computer comprises the controller, qubit management systems, and a plurality of physical qubits. A first slice of the plurality of circuit slices comprises a past causal cone of a first system qubit wire at a fully evolved level of the quantum circuit. An i-th slice of the plurality of circuit slices is defined to contain all gates that are not within a past causal cone of any system qubit wire of the quantum circuit that reaches the fully evolved level of the quantum circuit in slice i−j, where $0 \leq j \leq i$ is an integer, but that can now be executed by initiating one or more physical qubits that have reached the fully evolved level during execution of slice i−1, have optionally been measured, and reset onto the system qubit wires in a base level of slice i. For example, an i-th slice may contain all gates that are within a past causal cone of a system qubit wire that reaches the fully evolved level of the quantum circuit via execution of slice i that are not in the past causal cone of a system qubit wire that reaches the fully evolved level in slice i−j, where $0 < j \leq i$ is an integer. The controller causes execution of the i-th slice of the quantum circuit using the physical qubits of the quantum computer; causes a physical qubit that was evolved as the system qubit fully evolved via execution of the i-th slice to be optionally measured, and reinitialized and reintroduced onto a system qubit wire at a base level of the i+m-th slice, m a positive integer; and causes the quantum computer to use the physical qubit to execute the i+m-th slice of the quantum circuit.

According to another aspect, a method is provided. In an example embodiment, the method comprises receiving, by a controller of a quantum computer, a quantum circuit comprising a plurality of circuit slices. The quantum computer comprises qubit management systems and a plurality of physical qubits. A first slice of the plurality of circuit slices comprises a past causal cone of a first system qubit wire at a fully evolved level of the quantum circuit. An i-th slice of the quantum circuit is defined to contain all gates that are not within a past causal cone of any system qubit wire of the quantum circuit that reaches the fully evolved level of the quantum circuit in slice i−j, where $0 \leq j \leq i$ is an integer, but that can now be executed by initiating one or more physical qubits that have reached the fully evolved level during execution of slice i−1, have optionally been measured, and reset onto the system qubit wires in a base level of slice i. The method further comprises causing, by the controller, execution of the i-th slice of the quantum circuit using the physical qubits of the quantum computer; causing, by the controller, a physical qubit that was evolved as the system qubit fully evolved via execution of the i-th slice to be optionally measured, and reinitialized and reintroduced onto a system qubit wire at a base level of the i+m-th slice, m a positive integer; and causing, by the controller, the quantum computer to use the physical qubit to execute the i+m-th slice of the quantum circuit.

In an example embodiment, executing the i-th slice of the quantum circuit comprises executing all gates for which incoming and outgoing wires lie within the i-th slice in order to propagate the system qubits forward in time. In an example embodiment, the quantum circuit comprises at least one ancilla wire and executing the i-th slice of the quantum circuit comprises interacting one or more system qubits at a bottom of the i-th slice with at least one ancilla qubit via unitary gates in order to introduce initial correlations between the one or more system qubits at the bottom of the i-th slice and system qubits at the bottom of one or more other slices. In an example embodiment, the quantum circuit encodes interactions governed by a Hamiltonian characterized by local interactions. In an example embodiment, system qubit wire corresponds to a degree of freedom associated with a section of a physical domain being simulated. In an example embodiment, executing the i-th slice of the quantum circuit comprises evolving the degree of freedom in accordance with an operator. In an example embodiment, the operator is a Hamiltonian. In an example embodiment, the physical domain is one of a one dimensional, two dimensional, or three dimensional physical domain. In an example embodiment, the quantum circuit simulates the dynamics of the evolution of quantum states defined on a lattice representing the physical domain. In an example embodiment, the method further comprises performing one or more measurements of at least one physical qubit of the plurality of qubits to determine a value corresponding to at least one degree of freedom within the physical domain. In an example embodiment, at least one system qubit wire of the quantum circuit extends through multiple slices of quantum circuit.

According to yet another aspect, a computing entity is provided. In an example embodiment, the computing entity is in communication with a controller of a quantum computer. The quantum computer comprises qubit management systems and a plurality of physical qubits. The computing entity is configured to cause the controller to control elements of the quantum computer to receive, by the controller, a quantum circuit comprising a plurality of circuit slices. A first slice of the plurality of circuit slices comprises a past causal cone of a first system qubit wire at a fully evolved level of the quantum circuit. An i-th slice of the plurality of circuit slices is defined to contain all gates that are not within a past causal cone of any system qubit wires of the quantum circuit that reach the fully evolved level of the quantum circuit in slice i−j, where $0 \leq j \leq i$ is an integer, but that can now be executed by initiating one or more physical qubits that have reached the fully evolved level during execution of slice i−1, have optionally been measured, and reset onto the system qubit wires in a base level of slice i. The computing entity is further configured to cause the controller to control elements of the quantum computer to cause the quantum computer to execute of the i-th slice of the quantum circuit using the physical qubits; cause the quantum computer to initialize a physical qubit, which was evolved along at least one system qubit wire to be fully evolved via execution of the i-th slice, onto a system qubit wire at a base level of the i+m-th slice of the quantum circuit, m a positive integer; and cause the quantum computer to use the physical qubit to execute the i+m-th slice of the quantum circuit.

In an example embodiment, executing the i-th slice of the quantum circuit comprises executing all gates for which incoming and outgoing wires lie within the i-th slice in order to propagate the system qubits forward in time. In an example embodiment, the quantum circuit comprises at least one ancilla wire and executing the i-th slice of the quantum circuit comprises interacting one or more system qubits at a bottom of the i-th slice with at least one ancilla qubit via unitary gates in order to introduce initial correlations between the one or more system qubits at the bottom of the i-th slice and system qubits at the bottom of one or more other slices. In an example embodiment, the quantum circuit encodes interactions governed by a Hamiltonian characterized by local interactions. In an example embodiment, system qubit wire corresponds to a degree of freedom associated with a section of a physical domain being simulated. In an example embodiment, executing the i-th slice of the quantum circuit comprises evolving the degree of freedom in accordance with an operator. In an example embodiment, the operator is a Hamiltonian. In an example embodiment, the physical domain is one of a one dimensional, two dimensional, or three dimensional physical domain. In an example embodiment, the quantum circuit simulates the dynamics of the evolution of quantum states defined on a lattice representing the physical domain. In an example embodiment, The computing entity is further configured to cause the controller to control elements of the quantum computer to cause the quantum computer to perform one or more measurements of at least one physical qubit of the plurality of qubits to determine a value corresponding to at least one degree of freedom within the physical domain. In an example embodiment, at least one system qubit wire of the quantum circuit extends through multiple slices of quantum circuit.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF SOME EXAMPLE EMBODIMENTS

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "generally" and "approximately" refer to within engineering and/or manufacturing limits and/or within user measurement capabilities, unless otherwise indicated. Like numbers refer to like elements throughout.

I. Overview

Computing the dynamical properties of electronic and magnetic materials is useful for predicting many of their technologically important physical properties such as optical absorption and emission spectra, alternating current (AC) conductivity, magnetic susceptibility, magnetoresistance, spin-dynamics, and many other properties. Classical simulation of the dynamics of correlated quantum systems is extremely challenging, due to rapid growth of entanglement entropy, which limits state-of-the-art simulation methods like time-dependent density-matrix renormalization group (DMRG) to very short time-scales.

Quite generally, the memory and simulation time resources to classically simulate the dynamics of quantum systems grow exponentially in the system-size or final simulation time. In contrast, the advent of programmable quantum computers enables a variety of polynomial time algorithms for simulating quantum materials, which offer an exponential reduction in the resources required for conducting these simulations. However, near-term quantum computing hardware will have access to only a limited number (10's to 100's) of quantum bits (qubits), and will also be strongly limited by noise and gate errors.

Various embodiments of the present invention provide methods, apparatuses, computing entities, computer program products, systems, and/or the like for executing quantum circuits with efficient qubit usage such that a relatively small number of potentially noisy qubits may be used to solve complex problems that may be very difficult and/or intractable to solve via classical computing means.

Figure 3A:
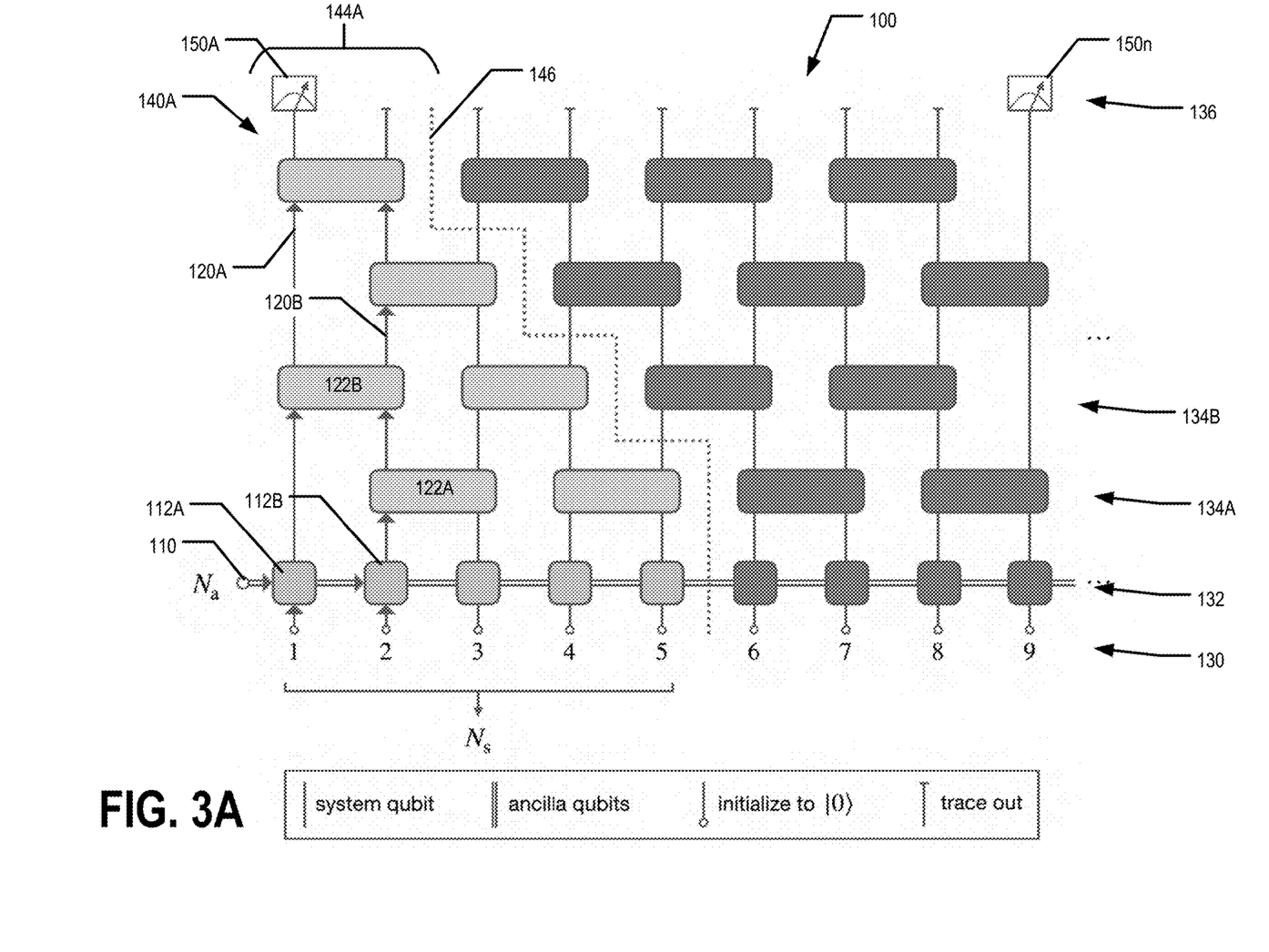
FIGS. 3A&B provide schematic diagrams of an example quantum circuit and the slicing of the example quantum circuit, in accordance with an example embodiment.

In various embodiments, a quantum computer implements a circuit of large width on a large number of "system qubits" (e.g., qubits evolved along system qubit wires of the circuit) using only a limited number of "physical qubits". First, the past causal cone of the quantum circuit output for the left-most system qubit wires is identified, which contains a subset of the system qubit wires along with at least one ancilla qubit. For example, the past causal cone of a first system qubit wire at the fully evolved level is identified and used to define the first slice 140A, as shown in FIG. 3A. For a given qubit in the circuit, we can define its past causal cone as the set of all qubits from which the given qubit can be reached by tracing the wires from past to future, exiting each gate by any of the wires flowing out of it. From this definition, the past causal cone of the qubits at the top of system qubit wires 1 and 2 shown in FIG. 3A contains all qubits to the lower-left of the dashed line (e.g., boundary 146) (including the qubits entering along system qubit wires 1-5, along with all qubits entering along the ancilla wires).

Figure 3B:
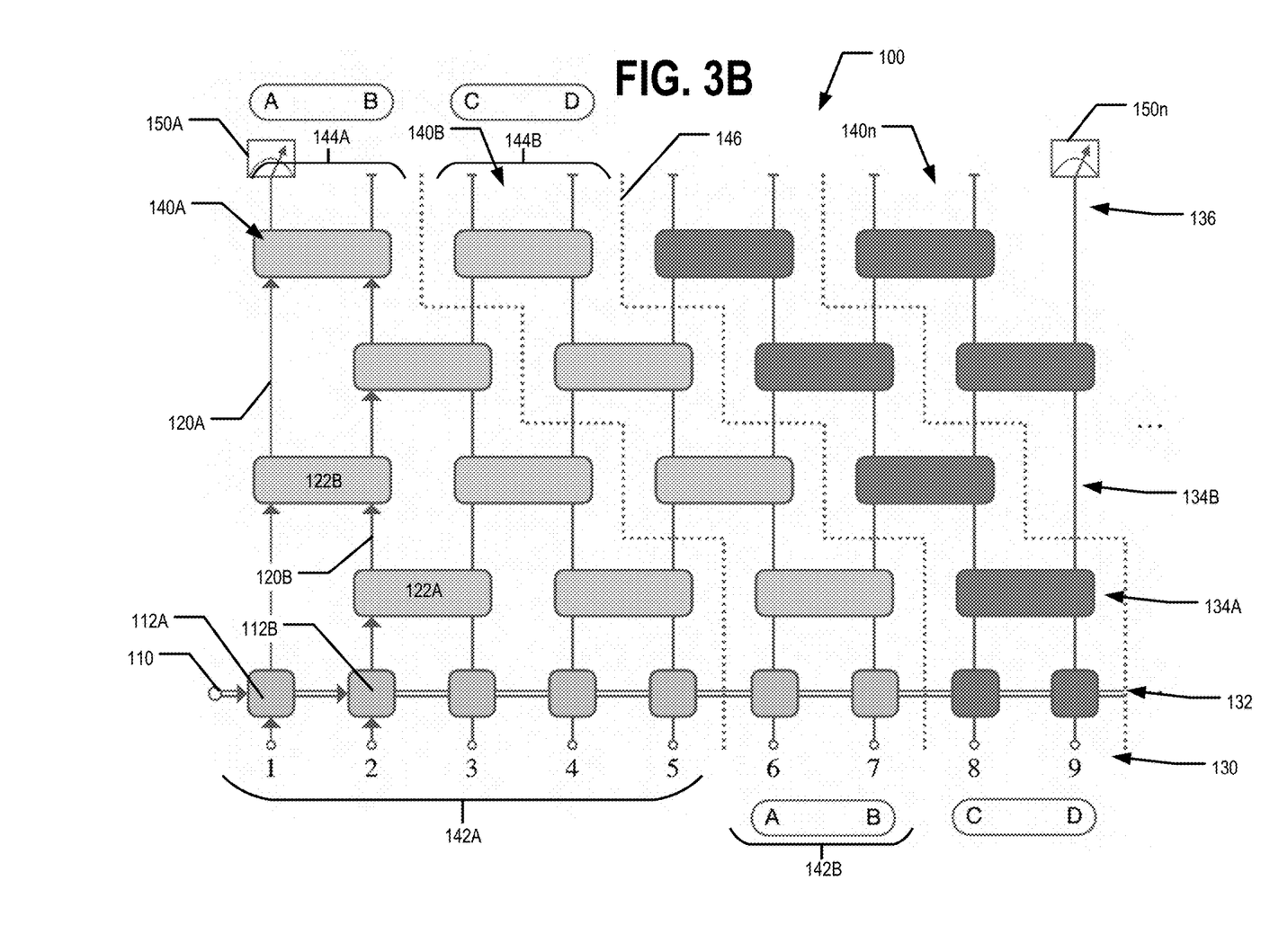

The quantum computer has sufficient physical qubits to process the restriction of the complete circuit contained within this past causal cone (the five left-most system qubit wires 120 on the bottom of the circuit in FIGS. 3A and 3B and the ancilla wires 110). The qubits evolved along these system qubit wires to the fully evolved level of the quantum circuit (e.g., at the output of this cone, labeled A and B in FIG. 3B) are measured if desired, reinitialized, and recycled back to the base level of the circuit, where they may be used to expand the causal cone by a slice to the right of the initial cone, encompassing more system qubits at the circuit output [in this case the 3rd and 4th qubits from the left at the top of the circuit, labeled C and D]. This process may be repeated to process and/or perform more slices of the circuit, until all of the slices of the quantum circuit have been processed and/or performed. At this point the entire quantum circuit has been faithfully executed and all desired measurements on the fully evolved level of the circuit have been obtained.

In various embodiments, a quantum circuit is defined. In various embodiments, the quantum circuit comprises a plurality of system qubit wires. In an example embodiment, a physical system or domain being modeled and/or simulated is discretized onto a lattice using any suitable technique (e.g., a tight-binding description of the material). Each point in that lattice contains a finite number (e.g., at most $d_s$) of quantum degrees of freedom. For example, the domain being modeled and/or simulated may be a 1-dimensional, 2-dimensional, or 3-dimensional physical system and/or domain (e.g., at least a portion of a physical material) and each system qubit wire may represent, model, simulate, and/or correspond to the evolution (e.g., in time) of a quantum degree of freedom, physical location, and/or particle within the system and/or domain. For example, a system qubit wire of the quantum circuit may simulate the evolution (e.g., in time) of one or more properties of a corresponding section within the system and/or domain. For example, the quantum circuit may simulate the dynamics of the evolution of quantum states of particles within a physical domain. In various embodiments, the domain may not be a physical domain and the domain may be more than 3-dimensional. For example, the domain may correspond to the spread of disease through a geographical area, logistics operations in a geographical area, financial indices, and/or other one or multi-dimensional domains.

Figure 2:
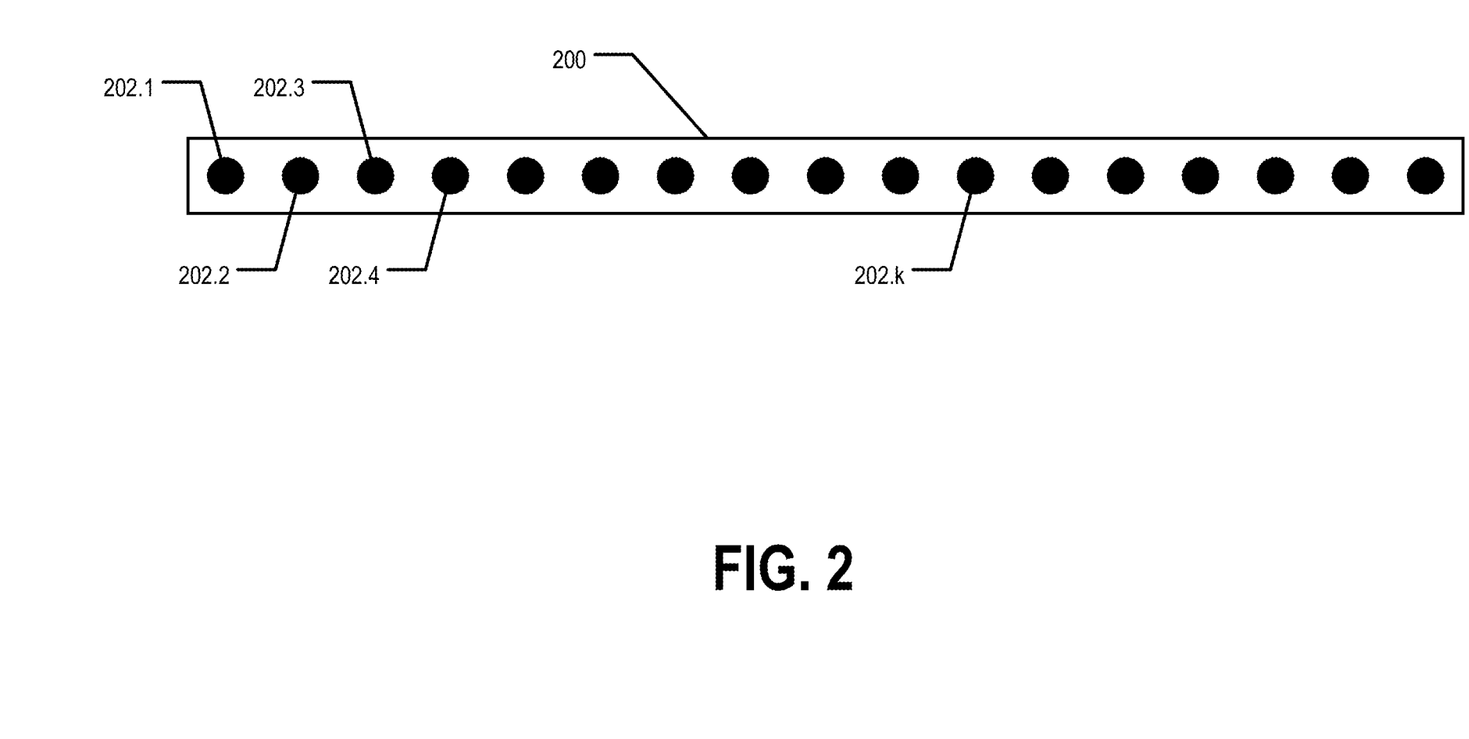
FIG. 2 provides a schematic diagram of an example domain divided into sections, in accordance with an example embodiment.

In various embodiments, time evolution and/or interaction between sections of a domain (and/or locations and/or particles and/or corresponding degrees of freedom within a section) are simulated and/or modeled via an operator. For example, a domain may be divided into sections. If the dimensionality of the domain is d, the dimensionality of each section is d−1. In various embodiments, the operator is a Hamiltonian. In various embodiments, the operator is a local operator. An operator H(t) is a local operator when $H(t)=\Sigma_k h_k(t)$, where k indexes successive (e.g., spatially adjacent) d−1 dimensional sections of the d dimensional lattice, and each operator term $h_k(t)$ acts on lattice sites that are contained within a section of distance of at most positive integer p from section k. For example, if the system and/or domain is a one dimensional system and/or domain, a section is zero dimensional (e.g., corresponds to a particular point within the system and/or domain) and each operator term $h_k(t)$ acts on at most p neighboring points of the system and/or domain. For example, FIG. 2 illustrates an example one dimensional system and/or domain 200 that has been divided into a plurality of sections 202 (e.g., 202.1, 202.2, 202.3, 202.4, 202.k). In an example embodiment, where p=2, $h_1(t)$ may act on degrees of freedom relating to sections 202.1, 202.2, and 202.3 but will not act on degrees of freedom in section 202.4. In another example embodiment, if the domain is a three dimensional domain, a section is two dimensional (e.g., a plane) and each operator term $h_k(t)$ acts within the two dimensional section and on degrees of freedom/points at most p sections from section k. For example, the operator term $h_k(t)$ does not act on every degree of freedom, location, and/or particle within the domain. For example, the operator term $h_k(t)$ may encode geometrically local interactions.

In various embodiments, the quantum circuit comprises one or more ancilla wire. In various embodiments, each ancilla qubit (e.g., a qubit being evolved along an ancilla wire) prepares correlations between various qubit wires (and/or the degrees of freedom of the domain represented thereby) that are present in the initial state corresponding to one or more initial properties of the domain across a section of the domain. For example, when a system qubit (e.g., a physical qubit being evolved along a system qubit wire 120) interacts with an ancilla qubit (e.g., a physical qubit being evolved along an ancilla wire 110) via a unitary gate 112 (see FIGS. 3A and 3B), the ancilla qubit imparts correlations between the initial state of various degrees of freedom in various sections. In an example embodiment, the ancilla qubits (e.g., qubits being evolved along ancilla wires) generate a matrix product state between the degrees of freedom in the various sections of the domain at the initial time t=0. In various embodiments, each system qubit is first initialized onto a system qubit wire, and then brought into a correlated state through interaction with one or more ancilla qubits via unitary gates. The system qubit then continues to be evolved along the system qubit wire by being gated with other system qubits (e.g., qubits being evolved along other system qubit wires) in order to simulate time evolution of the simulated system and/or domain under a local Hamiltonian.

In various embodiments, slices of the quantum circuit are defined. As described above, the quantum circuit comprises a plurality of system qubit wires that extend from the base level of the quantum circuit corresponding to time t=0 to the fully evolved level corresponding to time t=T. The quantum wires each relate to one or more degrees of freedom of a section of the simulated system and/or domain. A system qubit wire may pass through one or more slices of the quantum circuit.

In various embodiments, the quantum circuit is executed slice by slice 140 starting with the first slice 140A on the left side of FIG. 3B and moving left to right through each successive slice 140. For example, first, all gates within the first slice 140A (the triangular region) are executed, and any desired measurements of the qubits at the output of that slice 140A (e.g., fully evolved level 136) are made. Then, the physical qubits that have made it to the fully evolved level 136 (e.g., the top of the slice labeled A and B in FIG. 3B) are reset (e.g., reinitialized) and inserted at the bottom of the system qubit wires (e.g., base level 130) in the next slice 140. The gates within that slice 140 are then executed in accordance with the time ordering of the circuit (for example, red gates first, and then blue gates in ascending order from bottom to top). In the example FIG. 3B, the gates executed at this point in the procedure are light-shaded. The physical qubits that have made it to the top of this second slice 140B (labeled C and D in FIG. 3B) are then reset (e.g., reinitialized) and inserted back into the bottom of the third slice 140. At this point the gates in that third slice can be executed, and the procedure continues from left to right through all slices 140 until all gates 112, 122 have been executed, and all measurements 150 have been made.

In various embodiments, each slice of the quantum circuit begins at a base level of the quantum circuit and extends diagonally across the system qubit wires of the quantum circuit up to a fully evolved level. For example, if the quantum circuit simulates and/or models the evolution of the system and/or domain from time t=0 to time t=T, the base level of the quantum circuit corresponds to time t=0 and the fully evolved level corresponds to time t=T. In various embodiments, the i=1 slice is defined such that at least one system qubit wire is evolved from the base level to the fully evolved level, and must exclusively contain the complete past causal cone of the at least one system qubit wire at the fully evolved level. The past causal cone is defined by identifying all system qubits at the base level that can be connected to the fully evolved qubits by following wires through the gates in the direction of the arrows shown in FIGS. 3A and 3B. For example, a system qubit wire that reaches the fully evolved level in the i=1 slice is evolved from the base level to the fully evolved level without interaction with and/or evolution of any of the system qubit wires starting in the base level of the i>1 slices. In various embodiments, the i>1 slices may be defined recursively. For example, for a i≥1, the i+1 slice can be identified by taking the system qubit wires immediately to the right of the system qubit wires at the fully evolved level of the ith slice of the quantum circuit and then identifying the past causal cone of those system qubit wires immediately to the right of the system qubit wires at the fully evolved level of the ith slice. The system qubit wires immediately to the right of the system qubit wires at the fully evolved level of the ith slice include the system qubit wires that are directly connected by gates at the fully evolved level. The part of the identified past causal cone that does not intersection with slice i−j, for any non-negative integer j, is slice i+1. For example, a system qubit wire that reaches the fully evolved level in an i>1 slice is evolved to the fully evolved level without interaction with and/or evolution of any of the system qubit wires starting at and/or extending from the base level of an i+j slice, where j is a positive integer. Execution of an i>1 slice may include interaction with and/or evolution of one or more system qubit wires that started at and/or extend from the base level of an i−j slice, where j is a positive integer. In general, for a system qubit wire that reaches the fully evolved level in slice i may be gated with system qubit wires that originate (e.g., at the base level of the quantum circuit) from any of slices i−j,j any non-negative integer and not gated with system qubit wires that originate (e.g., at the base level of the quantum circuit) from any of slices i+j.

In various embodiments, the quantum circuit is executed slice by slice. For example, the quantum computer may execute a first slice of the quantum circuit such that one or more system qubit wires are initialized at the base level of the first slice and at least one system qubit wire is evolved to the fully evolved level of the first slice. A second slice of the quantum circuit may then be executed such that one or more system qubit wires are initialized at the base level of the second slice and at least one system qubit wire is evolved to the fully evolved level of the second slice. A third slice of the quantum circuit may then be executed and so on, until each slice of the quantum circuit has been executed.

In various embodiments, measurements may be taken of one or more properties of a qubit at various points of the evolution of the qubit along the corresponding qubit trace to determine one or more properties of the corresponding location and/or particle of the domain at the corresponding time. For example, when a physical qubit being evolved along a system qubit wire reaches the fully evolved level of the quantum circuit, one or more measurements may be taken to determine one or more properties of the location and/or particle corresponding to the system qubit wire at the time t=T. In various embodiments, once a physical qubit is evolved along a system qubit wire to the fully evolved level of slice i, and any desired measurements are made, it may be initialized and reintroduced at the base level of slice i+1 to be evolved along another system qubit wire.

In various embodiments, the execution of the quantum circuit in a slice by slice manner allows the for recycling of physical qubits. For example, by executing the quantum circuit in a slice by slice manner, a physical qubit of the quantum computer may be initialized along a plurality of system qubit wires of different slices. Thus, fewer physical qubits are required to fully execute the quantum circuit. Thereby, embodiments enable the execution of quantum circuits modeling and/or simulating complex system using a relatively small number of qubits.

II. Example System Architecture

Figure 1:
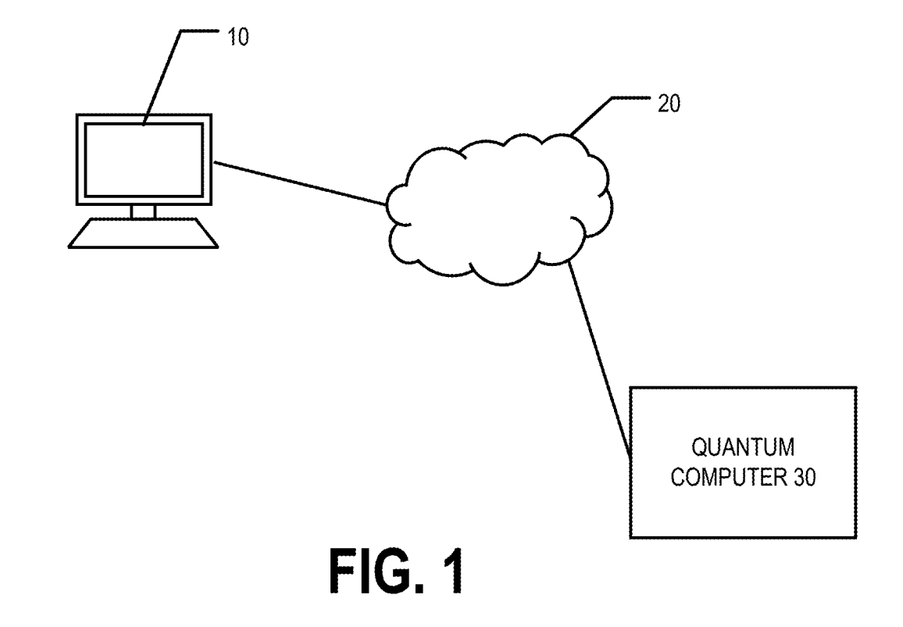
FIG. 1 provides a schematic diagram of an example system, in accordance with an example embodiment.

FIG. 1 provides a schematic diagram of an example system that may be used in accordance with an example embodiment. In various embodiments, the system comprises a user computing entity 10 and a quantum computer 30. In various embodiments, the quantum computer 30 comprises a controller 500, a plurality of qubits, and one or more qubit management systems. In various embodiments, the user computing entity 10 may communicate via wired or wireless communication with the controller 500 of the quantum computer 30. In various embodiments, the user computing entity 10 may be in direct communication with the controller 500 or may communicate with the controller 500 via one or more networks 20.

In various embodiments, a user computing entity 10 is configured to allow a user to provide input to the quantum computer 30 (e.g., via a user interface of the user computing entity 10) and receive, view, and/or the like output from the quantum computer 30. The user computing entity 10 may be in communication with the quantum computer 30 (e.g., controller 500) via one or more wired or wireless networks 20. In various embodiments, the quantum computer 30 may be a trapped ion quantum computer, nuclear magnetic resonance quantum computer, superconducting quantum computer, photonic quantum computer, and/or other kind of quantum computer.

In various embodiments, the controller 500 is configured to control one or more qubit management systems of the quantum computer 30 so as to manipulate and/or evolve one or more qubits of the quantum computer 30 in a desired manner. For example, the controller 500 may be configured to execute one or more quantum circuits by causing the one or more qubit management systems to manipulate and/or evolve the one or more qubits in a manner indicated and/or defined by the quantum circuit. For example, the one or more qubit management systems may comprise thermal control systems (e.g., cryogenic cooling systems), vacuum systems (e.g., pressure control systems), qubit confinement systems (e.g., an ion trap and voltage sources connected to the ion trap in the case of a trapped ion quantum computer), one or more gate systems (e.g., lasers and corresponding optics in the case of a trapped ion quantum computer), measurement systems (e.g., including optics, photodetectors, and/or the like in the case of a trapped ion quantum computer), and/or the like. By causing the one or more qubit management systems to manipulate and/or evolve the one or more qubits in accordance with the quantum circuit, the quantum computer 30 may perform calculations, simulations, generate models, and/or the like.

The user computing entity 10 may provide (e.g., transmit) quantum circuit(s), executable code portions (e.g., computer executable instructions, command sets, and/or the like) encoding the quantum circuit(s), and/or requests for the execution of one or more quantum circuits such that the controller 500 of the quantum computer 30 receives the quantum circuit(s), the executable code portions encoding the quantum circuit(s), and/or the requests. The quantum computer 30 may then execute a quantum circuit and determine, measure, and/or the like results of the execution of the quantum circuit, possibly in response to receiving a quantum circuit, executable code portions encoding the quantum circuit, and/or the request for the execution of a quantum circuit. The quantum computer 30 may then provide (e.g., transmit) the results of the execution of the quantum circuit and/or a result of processing the results of the execution of the quantum circuit such that user computing entity 10 receives the results of the execution of the quantum circuit and/or a result of processing the results of the execution of the quantum circuit. The user computing entity 30 may then use the results of the execution of the quantum circuit and/or a result of processing the results of the execution of the quantum circuit as input to one or more programs, cause the results of the execution of the quantum circuit and/or a result of processing the results of the execution of the quantum circuit to be displayed via a user interface of the user computing entity 10, cause the results of the execution of the quantum circuit and/or a result of processing the results of the execution of the quantum circuit to be stored in computer-readable memory, and/or the like.

III. Example Quantum Circuit

In various embodiments, a quantum circuit is a model for a quantum computation in which the quantum computation is a sequence of quantum gates. In various embodiments, the quantum circuit is divided into a plurality of slices. Executing the quantum circuit includes executing the slices in series. FIGS. 3A and 3B provide diagrams of an example quantum circuit 100. The quantum circuit 100 comprises a plurality of system qubit wires 120 (e.g., 120A, 120B). The quantum circuit 100 comprises a plurality of levels, starting with a base level 130 at which each system qubit wire begins with an initialization step and extending through a plurality of levels to a fully evolved level 136. As used herein a system qubit is a physical qubit 555 of the quantum computer 30 that is being evolved along a system qubit wire 120. Note that a single physical qubit 555 may, at various points in the algorithm, play the role of multiple different system qubits as a result of the qubit reuse scheme described herein. For example, a single physical qubit 555 may be successively re-introduced onto multiple system qubit wires after reaching the fully evolved state of a previous system qubit wire.

In various embodiments, the plurality of levels between the base level 130 and the fully evolved level 136 may comprise a unitary circuit level 132. In various embodiments, the quantum circuit 100 comprises one or more ancilla wires 110. As used herein an ancilla qubit is a physical qubit 555 of the quantum computer 30 that is being evolved along an ancilla wire 110. In various embodiments, the unitary circuit level 132 includes the interaction of an ancilla wire 110 with a system qubit wire 120. For example, an ancilla qubit may interact with the system qubit being evolved along the system qubit wire 120, for example, via a gate 112 (e.g., 112A, 112B). The interaction of the ancilla qubit and the system qubit via the gate 112 may cause the system qubit to be in a state corresponding to and/or approximating an initial state for the location and/or particle corresponding to the corresponding system qubit wire 120. For example, the interaction of the ancilla qubits and the system qubits may cause the system qubits to be in a state that approximates the lowest energy state of a Hamiltonian. The intermediate levels 134 (e.g., 134A, 134B) may correspond to the time evolution and/or interaction(s) between neighboring locations and/or particles within the domain, as described by an operator (e.g., Hamiltonian). For example, the intermediate levels 134 of a system qubit wire 120 may comprise interaction gates 122 (e.g., 122A, 122B) causing the time evolution and/or interaction between physical qubits being evolved along other system qubit wires. In contrast to physical qubits 555 evolved along system qubit wires 120, a physical qubit 555 evolved along an ancilla wire 110 will not be reused, in various embodiments.

In various embodiments, the quantum circuit 100 may include the taking of one or more measurements 150 (e.g., 150A, 150n. For example, the measurements 150 may indicate one or more properties of a location and/or particle within the domain at a corresponding time. For example, if measurements 150A are made of a first physical qubit evolved along a first system qubit wire 120A at fully evolved level 136, the measurements 150A indicate one or more properties corresponding to a first location or particle at the time t=T. The quantum circuit 100 may comprise a variety of measurements at different levels 134, 136 within the circuit and/or along different system qubit wires 120 as appropriate for the computation modeled by the quantum circuit 100.

The quantum circuit 100 has an implied time ordering whereby all system qubit (i.e. vertical) wires 120 run from the bottom (past) to the top (future), and the ancilla (i.e. horizontal) wires 110 run from the left (past) to the right (future). This direction is indicated by arrows on a subset of the wires in FIGS. 3A and 3B, though it exists in a similar manner for all of the wires.

In various embodiments, the quantum circuit 100 is divided into and/or comprises a plurality of slices 140 (e.g., 140A, 140B, ..., 140n). A slice 140 of the quantum circuit 100 extends from the base level 130 to the fully executed level 136 in a diagonal manner compared to the system qubit wires 120. For example, slice boundaries 146 (shown as the dotted lines in FIG. 3) may cross one or more system qubit wires 120. For example, an i-th slice 140i of the quantum circuit 100 may correspond to a base level qubit set 142i (e.g., 142A, 142B) and a fully evolved level qubit set 144i (e.g., 144A, 144B). The base level qubit set 142i comprises at least one system qubit wire 120 and the fully evolved level qubit set 144i comprises at least one system qubit wire 120. However, the base level qubit set 142i and the fully evolved level qubit set 144i may not have any overlap. For example, the fully evolved level qubit set 144i of the i-th slice 140i may not include any of the system qubit wires 120 in the base level qubit set 142i of the i-th slice 140i. In other words, a system qubit wire 120 may begin, at the base level 130, in the base level set 142i of the i-th slice and may reach the fully evolved qubit set 144(i+j) of the i+j-th slice 140(i+j), where j is a positive integer. For example, the i-th slice 140i extends diagonally across the intermediate levels 134 (e.g., 134A, 134B) to the fully evolved level 136.

In an example embodiment, for i>1, the base level qubit set 142i and the fully evolved level qubit set 144i include the same number of system qubit wires 120. In an example embodiment, for i, j>1, the base level qubit set 142i of the i-th slice and the base level qubit set 142j of the j-th slice include the same number of system qubit wires 120. In an example embodiment, the fully evolved level qubit set 144A of the first slice 140A includes the same number of system qubit wires 120 as the fully evolved level qubit set 144i of the i-th slice 140i. In various embodiments, the base level qubit set 142A of the first slice 140A includes a larger number of system qubit wires 120 compared to the base level qubit set 144i of the i-th slice 140i. In an example embodiment, the base level qubit set 142A of the first slice 140A includes the minimum number of system qubit wires 120 required for at least one system qubit wire 120 of the base level qubit set 142A to be fully evolved. For example, the first slice 140A may be the only slice 140 for which there exists an overlap between the base level qubit set 142A and the fully evolved level qubit set 144A.

In various embodiments, the quantum circuit 100 is a circuit and/or algorithm to simulate the dynamics $|\psi(t)\rangle = U(t)|\psi(0)\rangle = \mathcal{T}[e^{-i\int_0^t H(s)ds}]|\psi(0)\rangle$ of the evolution of quantum states $|\psi(0)\rangle$, represented as a matrix product state (MPS) with bond-dimension $\chi$, subjected to a geometrically local (possibly time-dependent) operator that takes the form of a Hamiltonian, H(t). Here $\mathcal{T}$-denotes the time-ordered product. MPS's can represent any pure- or mixed-quantum states for sufficiently large bond-dimension $\chi$. Classical computing methods for MPS's generically require computing time and memory resources that scale polynomially in the bond-dimension $\chi$, typically limiting them to short-time dynamics and to one-dimensional or quasi-one-dimensional systems. In contrast, various embodiments enable an exponential reduction in the bond-dimension $\chi$-dependence of quantum computational resources, enabling computations to be performed for a much larger range of quantum states, longer-time ranges, and higher-dimensional (e.g., 2-dimensional and 3-dimensional) materials and/or domains.

In various embodiments, the domain to be simulated and/or modeled is approximated by a discrete mesh with a finite number, $d_s$, of quantum degrees of freedom per site, using any standard orbital basis (e.g. a tight-binding description) for the electronically relevant orbitals. Various embodiments are agnostic to the particular choice of orbital basis. Various embodiments simulate and/or model time-dynamics generated by a local Hamiltonian H(t)=$\Sigma_k h_k(t)$, where, as used herein the term "local" means that each term, $h_k(t)$, acts on lattice sites that are contained within sections of distance of at most positive integer p from section k.

To simulate dynamical properties over a range of times time intervals t∈[0, T], of a system or domain discretized onto a lattice of integer linear and cross-sectional dimensions L×A, with accuracy ~$\epsilon$, various embodiments require $$N_Q \sim O(\frac{T^2}{\epsilon} pA$$

log$_2$ d$_2$+log$_2$ $\chi$) physical qubits and a quantum circuit depth $$D \sim O\left(L\frac{T^2}{\epsilon}\right).$$

Here L is the number of lattice points/sites in the direction along which the lattice is being divided into sections and A is the number of lattices points/sites contained within each section. In an example embodiment, the system and/or domain is divided into sections along its longest dimension, which makes the algorithm more efficient. For example, the sections may be taken orthogonal and/or transverse to the longest dimension of system and/or domain.

In various embodiments, quantum circuits 100 divide the physical qubits into $$N_s = O\left(\frac{T^2}{\epsilon} pA\log_2 d_s\right)$$

qubits moving along the system qubit wires, prepared in some fixed initial state, which iteratively interact with a register of $N_\alpha$~O(log$_2$ $\chi$) additional ancilla wire. Strategic use of opportunistic measurement and reset and re-use of physical qubits serially along one or more system qubit wires enable various embodiments to simulate very large systems with a relatively small number of qubits.

In various embodiments, the quantum circuit may be defined, generated, and/or determined as follows. In various embodiments, the continuous time-evolution by the Hamiltonian of the quantum state of the locations and/or particles of the domain is decomposed into a discrete quantum circuit of N levels (e.g., 130, 132, 134, 136) of disjoint terms acting on p sections of the simulated system and/or domain. In various embodiments, this decomposition of the time-evolution is performed using a variety of standard methods. For example, in an example embodiment, the Trotter-Suzuki formula $$U(t) = \mathcal{T}\left[e^{-i\int_0^t H(s)ds}\right] \approx \prod_{\alpha=1}^{N}\prod_{\mu=1}^{p}\left(\prod_{i=\mu,\mu+p,...} e^{-\frac{iT}{N}h_i(t_\alpha)}\right) + O\left(\frac{T^2}{N}\right),$$

with $$t_\alpha = \alpha\frac{T}{N}$$

(this equation represents only the simplest Trotter decomposition, but can be straightforwardly generalized to higher-order version of the Trotter-Suzuki decomposition) is used to perform the decomposition. The initial matrix product state may be defined and/or determined and tensors $V_{\alpha,\beta}^\sigma$ in left-canonical form may be extracted therefrom. In various embodiments, the interactions between ancilla qubits (e.g., qubits being evolved along ancilla wires 110) and system qubits (e.g., qubits being evolved along system qubit wires 120) may be defined based on the tensors $V_{\alpha,\beta}^\sigma$ extracted from and/or determined by the initial matrix product state for the domain. Without loss of generality, it is assumed that the tensors are in left-canonical form, such that $V_{\alpha,\beta}^\sigma$ is an isometry, and can be implemented by a unitary circuit $U_V$ acting on the ancilla and system qubits, with the system qubits initialized in a fixed initial state $|0\rangle$ (at the base level 130). In an example embodiment, the unitary circuit $U_V$, the tensors $V_{\alpha,\beta}^\sigma$, and the fixed initial state $|0\rangle$ satisfy $\langle\sigma, \alpha|U_V|0,\beta\rangle = V_{\alpha,\beta}^\sigma$. In various embodiments, the unitary circuit $U_V$ is generated either by prior knowledge of the state, or by variationally optimizing a parameterized family of circuits, for example, to variationally approximate the lowest energy state of the Hamiltonian of the material and/or domain being modeled and/or simulated. In various embodiments, the result is a quantum circuit 100 that may then be divided into a plurality of slices 140.

In various embodiments the time-evolution quantum circuit 100 is implemented on a quantum computer with $N_\alpha = O(\log_2 \chi)$ ancilla qubits, which interact with system qubits along $(LA \log_2 d_s)$ system qubit wires 120 represented by only $$N_s = O\left(\frac{T^2}{\epsilon} pA \log_2 d_s\right)$$

physical qubits. The quantum circuit is divided into a plurality of slices 140 each having a fully evolved level qubit set 144 including $O(p\ A\ \log_2\ d_s)$ system qubit wires and a sequence of quantum gates to implement the $U_V$ and the operations $$e^{-\frac{iT}{N}h_i}.$$

For example, the example quantum circuit 100 shown in FIG. 3 corresponds to A=1, $d_s$=2, and p=2.

The quantum circuit 100 may then be executed. In various embodiments, each level of the first slice 140A is executed across each level in order from the base level 130, then the unitary circuit level 132, then the intermediate levels 134 in order (e.g., the first intermediate level 134A, then the second intermediate level 134B, and so forth), until the fully evolved level 136 is reached. For example, each physical qubit that will be evolved along a system qubit wire 120 of the base level qubit set 142A of the first slice 140A is initialized into the fixed initial state |0>. Then the physical qubits that will be evolved along the ancilla wires 110 are initialized and the circuit implementing the unitary circuit $U_V$ is applied to the physical qubits being evolved along the ancilla wires 110 and physical qubits being evolved along the system qubit wires 120 of the first slice 140A at gates 112 (e.g., 112A, 112B). The interaction gates 122 (e.g., 122A, 122B) are executed of each intermediate level 134 until the fully executed level 136 is reached. In various embodiments, the interaction gates 122 implement $$e^{-\frac{iT}{N}h_k}$$

to the physical qubits being evolved along the system qubit wires 120 of the first slice 140A. Once the first slice 140A has been fully executed, the physical qubits evolved along the system qubit wires 120 of the fully evolved level qubit set 144A of the first slice are reset and initialized onto the system qubit wires 120 of the base level qubit set 142B of the second slice 140B.

For i>1, the i-th slice may be executed by resetting the physical qubits that were evolved along the system qubit wires 120 of the i−1-th slice fully evolved level qubit set 144(i−1) such that those physical qubits are initialized into the fixed initial state |0> at the base level 130 of the i-th slice 140i (e.g., on the system qubit wires 120 of the base level qubit set 142i of the i-th slice 140i). The unitary circuit gates 112 of the i-th slice 140i are executed at the unitary circuit level 132 of the i-th slice. The interaction gates 122 of the first intermediate level 134A are then executed to implement $$e^{-\frac{iT}{N}h_k}.$$

The remaining intermediate levels 134 are then executed in order as the slice 140i crosses system qubit wires 120 that were initialized in previous slices 140(i−j) until the fully evolved level 136 is reached. The process may then be repeated for the i+1-th slice 140(i+1), until all of the slices have been fully executed.

This procedure gives access to any measurable quantities of the time-evolved state, by measuring a desired observable on the physical qubits evolved along a system qubit wire 120 at the fully evolved level 136, before resetting the physical qubits for re-use in the next slice. To measure observables at intermediate times, one can simply interrupt the execution of the quantum circuit 100, and perform measurement of the desired observable on the physical qubit at the desired time (e.g., at the intermediate level 134 corresponding to the desired time).

IV. Example System Operation

Figure 4:
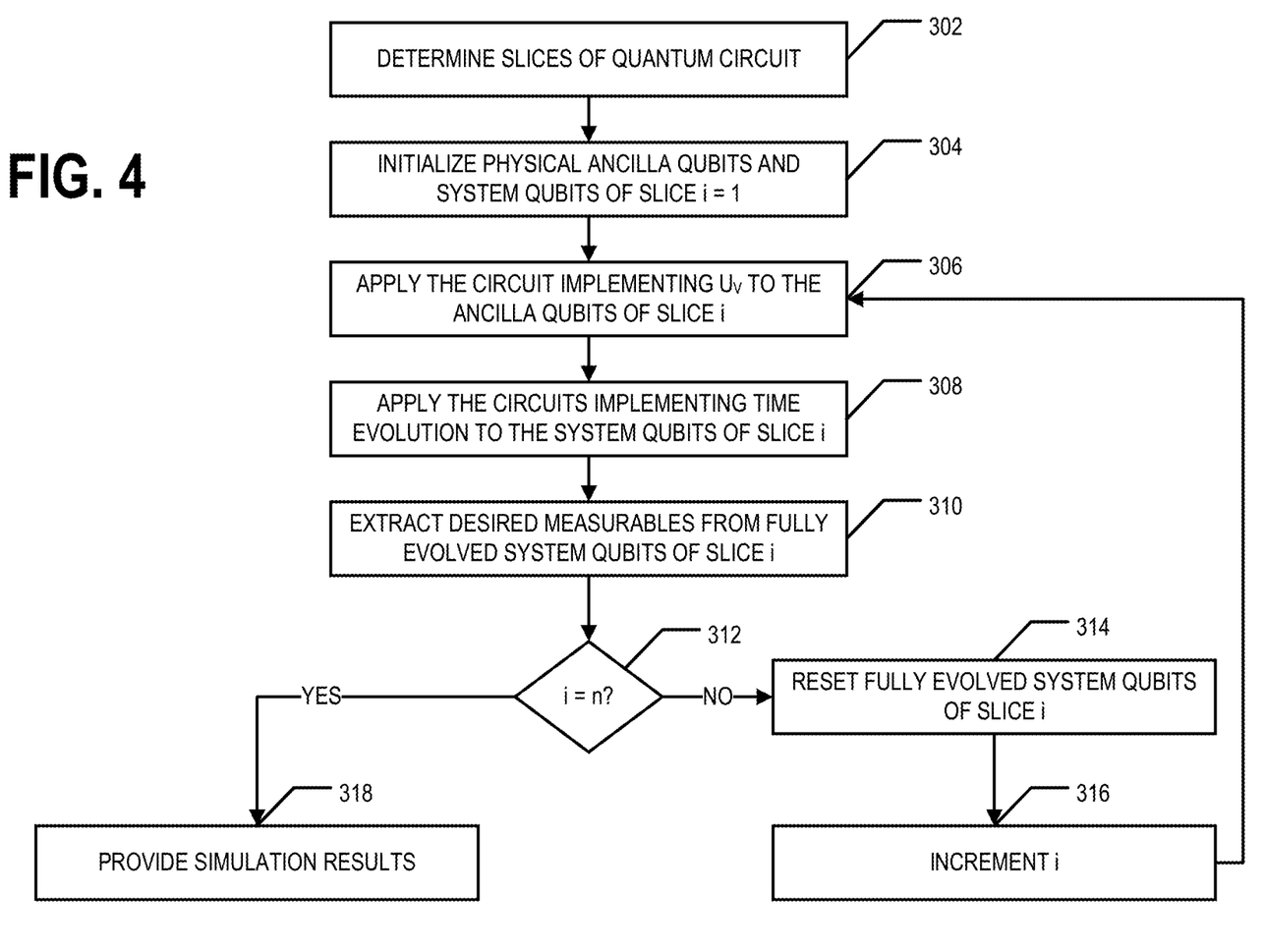
FIG. 4 provides a flowchart illustrating various processes, procedures, and/or operations performed by a quantum computer for executing a quantum circuit with efficient qubit usage.

FIG. 4 provides a flowchart illustrating various processes, procedures, and/or operations performed by a quantum computer 30 for executing a quantum circuit with efficient qubit usage. Starting at step/operation 302, a quantum circuit 100 is defined and slices 140 of the quantum circuit are determined and/or defined. In an example embodiment, the quantum circuit 100 and/or the slices 140 of the quantum circuit may be defined by a user computing entity 10 (e.g., either automatically (e.g., by a machine user) or via user interaction with a user interface) and/or by a controller 500 of the quantum computer 30. In an example embodiment, the quantum circuit 100 may be defined by the user computing entity 10 and provided such that the controller 500 of the quantum computer 30 receives the quantum circuit 100 and defines the slices 140 of the quantum circuit. In an example embodiment, the quantum circuit 100 and the slices 140 of the quantum circuit are defined by the user computing entity 10 and provided such that the controller 500 of the quantum computer 30 receives the quantum circuit 100 with the slices 140 thereof already defined. For example, the user computer entity may provide the quantum circuit 100 with the slices 140 of the quantum circuit defined. The controller 500 may then receive (e.g., at the processing device 505 via the communication interface 520) the quantum circuit 100 with slices 140 thereof defined. In various embodiments, n slices 140 of the quantum circuit 100 are defined.

At step/operation 304, the physical qubits that are to be evolved along the system qubit wires of the first slice 140A are initialized (e.g., the physical qubits to be evolved along the system qubit wires 120 of the base level qubit set 142A of the first slice 140A). For example, the base level 130 of the first slice 140A may be executed. For example, the controller 500 (e.g., via the processing device 505, the driver component elements 515, and/or the like) may cause one or more qubit management systems 550 to manipulate physical qubits 555 of the quantum computer 30 such that physical qubits are initialized onto the system qubit wires 120 of the base level qubit set 142A of the first slice 140A and onto the ancilla wires 110. For example, the index i is initialized at 1 and the base level 130 of the i-th slice is executed.

At step/operation 306, the unitary circuit level 132 of the i-th slice is executed. For example, the controller 500 (e.g., via the processing device 505, the driver component elements 515, and/or the like) may cause one or more qubit management systems 550 to manipulate physical qubits 555 of the quantum computer 30 such that the unitary circuit level 132 of the i-th slice is executed. For example, the unitary $U_V$ may be applied to the physical qubits being evolved along the ancilla wires 110 and the system qubit wires 120 across the unitary circuit level 132 of the i-th slice. For example, unitary circuit gates 112 may be applied to the physical qubits being evolved along the ancilla wires 110 and physical qubits being evolved along system qubit wires 120 of the i-th slices.

At step/operation 308, the circuits applying the time evolution of the system qubit wires 120 of the i-th slice are executed. For example, the intermediate levels 134 of the i-th slice are executed in order. For example, the first intermediate level 134A may be executed, followed by the second intermediate level 134B, and so on until the fully evolved level 136 of the i-th slice is achieved. In various embodiments, the controller 500 (e.g., via the processing device 505, the driver component elements 515, and/or the like) may cause one or more qubit management systems 550 to manipulate physical qubits 555 of the quantum computer 30 such that the interaction gates 122 are executed in accordance with the intermediate levels 134 of the quantum circuit 100.

At step/operation 310, any desired measurements corresponding to fully evolved qubit set 144$i$ of the i-th slice are captured. For example, the controller 500 (e.g., via the processing device 505, the driver component elements 515, and/or the like) may cause one or more qubit management systems 550 to manipulate physical qubits 555 of the quantum computer 30 such that any desired measurements of the physical qubits 555 that were evolved (e.g., along system qubit wires 120) to the fully executed level 136 of the i-th slice are captured. Step/operation 310 may be, but is not required to be, initiated after the completion of step 308, and may, for example, be implemented simultaneously with step/operation 308, such that measurements can be made at intermediate circuit levels 134.

At step/operation 312, the controller 500 (e.g., via the processing device 505 and/or the like) may determine whether the index i is equal to n, the number of slices of the circuit. When it is determined, at step/operation 312, that the index i is not equal to n, the process continues to step/operation 314.

At step/operation 314, the physical qubits evolved along the system qubit wires 120 of the fully executed level qubit set 144$i$ of the i-th slice are reset so that they may be initialized in the base level 130 of (i+1)-th slice 140(i+1). For example, the controller 500 (e.g., via the processing device 505, the driver component elements 515, and/or the like) may cause one or more qubit management systems 550 to manipulate physical qubits 555 of the quantum computer 30 such that the physical qubits evolved along the system qubit wires 120 of the fully executed level qubit set 144$i$ of the i-th slice are reset such that they may be initialized onto the system qubit wires of the base level qubit set 142(i+1) of the (i+1)-th slice. For example, once a physical qubit has been fully evolved along a system qubit wire 120 (e.g., reached the fully evolved level 136), the physical qubit 555 may be re-initialized onto another system qubit wire starting in a subsequent slice of the quantum circuit. In this manner, physical qubits may be reused within the execution of the quantum circuit 100 to reduce the total number of physical qubits 555 needed to execute the quantum circuit.

At step/operation 316, the controller 500 increments the index i. For example, the controller (e.g., via the processing device 505 and/or the like) may increment the index i to the value i+1. For example, the index i may be incremented and the next slice may be executed.

When, at step/operation 312, it is determined by the controller 500 that the index i=n (the number of slices of the quantum circuit 100), the process continues to step/operation 318. At step/operation 318, the execution of the quantum circuit 100 is determined to be complete and the controller 500 may provide the results of the execution of the quantum circuit 100. For example, the controller 500 (e.g., by the processing device 505 via the communication interface 520, and/or the like) may provide the measurements captured during the execution of the quantum circuit 100. For example, the controller 500 may provide the results of executing the quantum circuit 100 such that the user computing entity 10 receives the results of executing the quantum circuit 100. The user computing entity 10 may then use the results as input to one or more processes (e.g., to analyze the results of executing the quantum circuit and/or the like), cause at least a portion of the results of executing the quantum circuit 100 to be displayed and/or provided via a user interface of the user computing entity 10 (e.g., via display 416), cause at least a portion of the results of executing the quantum circuit 100 to be stored in memory (e.g., memory 422, 424), and/or the like.

V. Technical Advantages

Various embodiments provide technical solutions to the technical problem of simulating the dynamics of a domain under the influence of a local operator (e.g., a local Hamilton) using a quantum computer that has a relatively small number of potentially noisy qubits. For example, various embodiments allow the use of a quantity of qubits (e.g., 1-500 qubits, 10-100 qubits, 20-50 qubits, and/or the like) to simulate the dynamics of a physical domain (e.g., a much larger physical domain) under the influence of a local operator (e.g., a local Hamiltonian) that would be very computationally expensive and/or intractable using classical computing means. In various embodiments, the dividing of a quantum circuit into slices and the executing of the slices in order allows for the re-use of physical qubits along various qubit traces, thereby reducing the number of physical qubits needed to perform the computation (e.g., execute the quantum circuit). Various embodiments effectively reduce the dimensionality of the system and/or domain being simulated by one. For example, a one dimensional system of length $L_x$ may be simulated, in an example embodiment, using only a small number (independent of length $L_x$) of physical qubits. In another example, a two dimensional system and/or domain of dimensions $L_x$, $L_y$ may be simulated, in an example embodiment, using a number of qubits that scales with $L_y$ (which may be selected to be the smaller/shorter of the two lengths $L_x$, $L_y$) but is independent of $L_x$. Embodiments therefore provide an improvement to the functioning of a quantum computer by enabling complex computations to be performed using fewer qubits.

VI. Exemplary User Computing Entity

Figure 5:
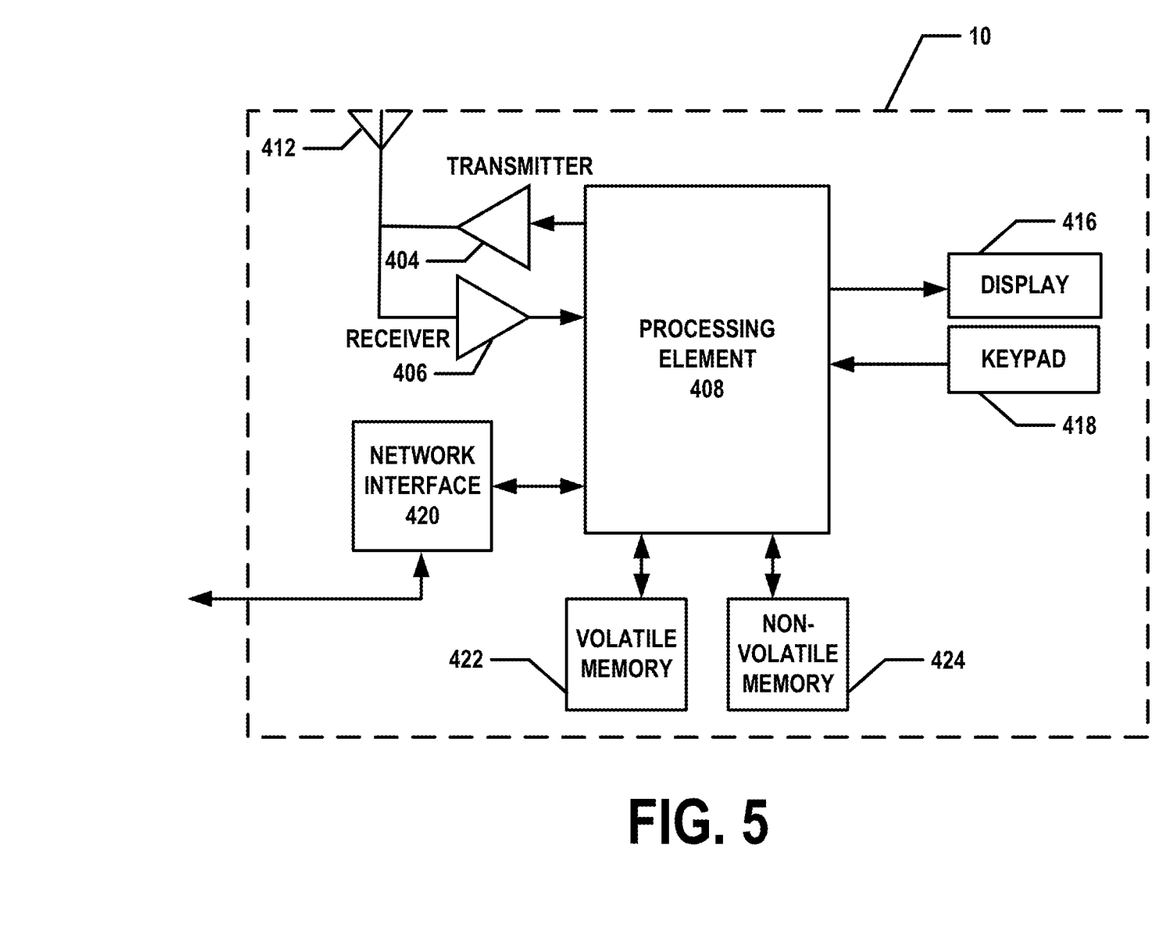
FIG. 5 provides a schematic diagram of an example user computing entity that may be used in accordance with an example embodiment.

FIG. 5 provides an illustrative schematic representative of an example user computing entity 10 that can be used in conjunction with embodiments of the present invention. In various embodiments, a user computing entity 10 is configured to allow a user to provide input to the quantum computer 30 (e.g., via a user interface of the user computing entity 10) and receive, view, and/or the like output from the quantum computer 30.

As shown in FIG. 5, a user computing entity 10 can include an antenna 412, a transmitter 404 (e.g., radio), a receiver 406 (e.g., radio), and a processing element 408 that provides signals to and receives signals from the transmitter 404 and receiver 406, respectively. The signals provided to and received from the transmitter 404 and the receiver 406, respectively, may include signaling information/data in accordance with an air interface standard of applicable wireless systems to communicate with various entities, such as a controller 500 of a quantum computer 30, and/or the like. In this regard, the user computing entity 10 may be capable of operating with one or more air interface standards, communication protocols, modulation types, and access types. More particularly, the user computing entity 10 may operate in accordance with any of a number of wireless communication standards and protocols. In a particular embodiment, the user computing device 10 may operate in accordance with multiple wireless communication standards and protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra wideband (UWB), infrared (IR) protocols, near field communication (NFC) protocols, Wibree, Bluetooth protocols, wireless universal serial bus (USB) protocols, and/or any other wireless protocol.

Via these communication standards and protocols, the user computing entity 10 can communicate with various other entities using concepts such as Unstructured Supplementary Service information/data (USSD), Short Message Service (SMS), Multimedia Messaging Service (MMS), Dual-Tone Multi-Frequency Signaling (DTMF), and/or Subscriber Identity Module Dialer (SIM dialer). The user computing entity 10 can also download changes, add-ons, and updates, for instance, to its firmware, software (e.g., including executable instructions, applications, program modules), and operating system.

According to one embodiment, the user computing entity 10 may include location determining aspects, devices, modules, functionalities, and/or similar words used herein interchangeably. For example, the user computing entity 10 may include outdoor positioning aspects, such as a location module adapted to acquire, for instance, latitude, longitude, altitude, geocode, course, direction, heading, speed, UTC, date, and/or various other information/data. In one embodiment, the location module can acquire data, sometimes known as ephemeris data, by identifying the number of satellites in view and the relative positions of those satellites. The satellites may be a variety of different satellites, including LEO satellite systems, DOD satellite systems, the European Union Galileo positioning systems, the Chinese Compass navigation systems, Indian Regional Navigational satellite systems, and/or the like. Alternatively, the location information/data may be determined by triangulating the user computing entity's 10 position in connection with a variety of other systems, including cellular towers, Wi-Fi access points, and/or the like. Similarly, the user computing entity 10 may include indoor positioning aspects, such as a location module adapted to acquire, for example, latitude, longitude, altitude, geocode, course, direction, heading, speed, time, date, and/or various other information/data. Some of the indoor aspects may use various position or location technologies including RFID tags, indoor beacons or transmitters, Wi-Fi access points, cellular towers, nearby computing devices (e.g., smartphones, laptops) and/or the like. For instance, such technologies may include iBeacons, Gimbal proximity beacons, BLE transmitters, Near Field Communication (NFC) transmitters, and/or the like. These indoor positioning aspects can be used in a variety of settings to determine the location of someone or something to within inches or centimeters.

The user computing entity 10 may also comprise a user interface device comprising one or more user input/output interfaces (e.g., a display 416 and/or speaker/speaker driver coupled to a processing element 408 and a touch screen, keyboard, mouse, and/or microphone coupled to a processing element 408). For instance, the user output interface may be configured to provide an application, browser, user interface, interface, dashboard, screen, webpage, page, and/or similar words used herein interchangeably executing on and/or accessible via the user computing entity 10 to cause display or audible presentation of information/data and for user interaction therewith via one or more user input interfaces. The user input interface can comprise any of a number of devices allowing the user computing entity 10 to receive data, such as a keypad 418 (hard or soft), a touch display, voice/speech or motion interfaces, scanners, readers, or other input device. In embodiments including a keypad 418, the keypad 418 can include (or cause display of) the conventional numeric (0-9) and related keys (#, *), and other keys used for operating the user computing entity 10 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the user computing entity 10 can collect information/data, user interaction/input, and/or the like.

The user computing entity 10 can also include volatile storage or memory 422 and/or non-volatile storage or memory 424, which can be embedded and/or may be removable. For instance, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database management system entities, data, applications, programs, program modules, scripts, source code, object code, byte code, compiled code, interpreted code, machine code, executable instructions, and/or the like to implement the functions of the user computing entity 10.

In example embodiments, the user computing entity 10 may be in communication with other user computing entities 10 and/or a controller 500 of a quantum computer.

VII. Exemplary Quantum Computer

Figure 6:
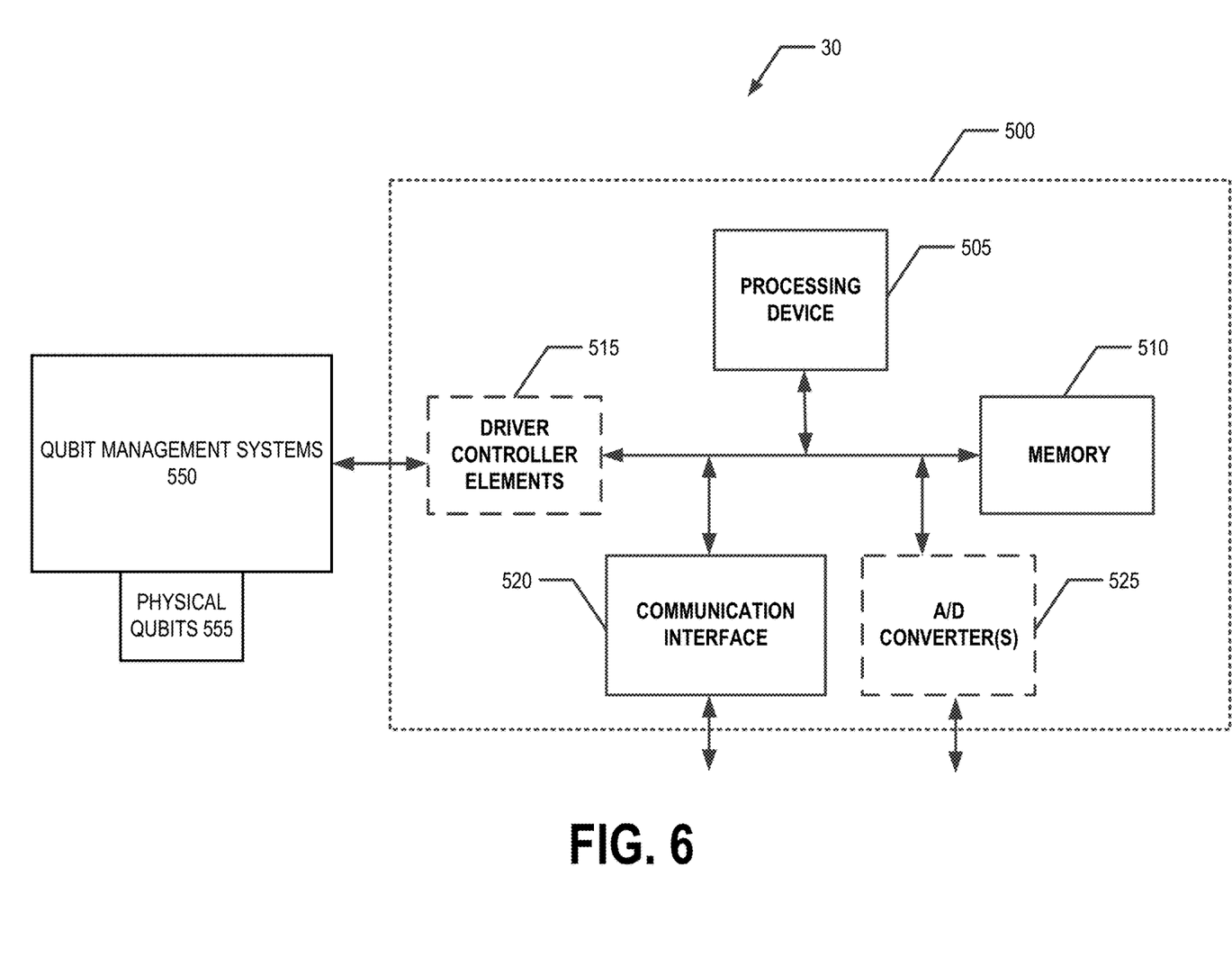
FIG. 6 provides a schematic diagram of an example quantum computer that may be used in accordance with an example embodiment.

As shown in FIG. 6, in various embodiments, a quantum computer 30 comprises a controller 30 and one or more qubit management systems 550. For example, the one or more qubit management systems 550 may comprise thermal control systems (e.g., cryogenic cooling systems), vacuum systems (e.g., pressure control systems), qubit confinement systems (e.g., an ion trap and voltage sources connected to the ion trap in the case of a trapped ion quantum computer), one or more gate systems (e.g., lasers and corresponding optics in the case of a trapped ion quantum computer), measurement systems (e.g., including optics, photodetectors, and/or the like in the case of a trapped ion quantum computer), and/or the like. The controller 30 is configured and/or programmed to cause the one or more qubit management systems 550 to manipulate and/or evolve the one or more qubits in accordance with a quantum circuit enabling the quantum computer 30 to perform calculations, simulations, generate models, and/or the like. In various embodiments, the qubit management systems 550 are configured to control, contain, manipulate, manage, and/or cause the controlled evolution of one or more physical qubits 555 of the quantum computer 30.

In various embodiments, the controller 500 may comprise various controller elements including processing devices 505, memory 510, driver controller elements t15, a communication interface 520, analog-digital converter elements 525, and/or the like. For example, the processing devices 505 may comprise programmable logic devices (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, other processing devices and/or circuitry, controllers, and/or the like. The term circuitry may refer to an entirely hardware embodiment or a combination of hardware and computer program products. In an example embodiment, the processing device 505 of the controller 500 comprises a clock and/or is in communication with a clock. For example, the memory 510 may comprise non-transitory memory such as volatile and/or non-volatile memory storage such as one or more of as hard disks, ROM, PROM, EPROM, EEPROM, flash memory, MMCs, SD memory cards, Memory Sticks, CBRAM, PRAM, FeRAM, RRAM, SONOS, racetrack memory, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. In various embodiments, the memory 510 may store qubit records corresponding the qubits of quantum computer (e.g., in a qubit record data store, qubit record database, qubit record table, and/or the like), a calibration table, an executable queue, computer program code (e.g., in a one or more computer languages, specialized controller language(s), and/or the like), and/or the like. In an example embodiment, execution of at least a portion of the computer program code stored in the memory 510 (e.g., by a processing device 505) causes the controller 500 to perform one or more steps, operations, processes, procedures and/or the like described herein for receiving a quantum circuit, executing a quantum circuit (e.g., slice by slice), and providing the results of executing the quantum circuit.

In various embodiments, the driver controller elements 515 may include one or more drivers and/or controller elements each configured to control one or more drivers. In various embodiments, the driver controller elements 515 may comprise drivers and/or driver controllers. For example, the driver controllers may be configured to cause one or more corresponding driver to be operated in accordance with executable instructions, commands, and/or the like scheduled and executed by the controller 500 (e.g., by the processing device 505). In various embodiments, the driver controller elements 515 may enable the controller 500 to operate the one or more qubit management systems 550 to manipulate, manage, and/or evolve one or more physical qubits 555 of the quantum computer in accordance with a quantum circuit 100. In various embodiments, the drivers may be laser drivers; vacuum component drivers; drivers for controlling the flow of current and/or voltage applied to DC, RF, and/or other electrodes used for maintaining and/or controlling, managing, and/or evolving the physical qubits 555; cryogenic and/or vacuum system component drivers; and/or the like. In various embodiments, the controller 500 comprises means for communicating and/or receiving signals from one or more optical receiver components such as cameras, MEMs cameras, CCD cameras, photodiodes, photomultiplier tubes, and/or the like. For example, the controller 500 may comprise one or more analog-digital converter elements 525 configured to receive signals from one or more optical receiver components, calibration sensors, and/or the like. In various embodiments, the controller 500 may comprise a communication interface 520 for interfacing and/or communicating with a user computing entity 10. For example, the controller 500 may comprise a communication interface 520 for receiving executable instructions, command sets, and/or the like from the user computing entity 10 and providing output received from the quantum computer 30 (e.g., from an optical collection system) and/or the result of a processing the output to the user computing entity 10. In various embodiments, the user computing entity 10 and the controller 500 may communicate via a direct wired and/or wireless connection and/or one or more wired and/or wireless networks.

As will be appreciated, one or more of the controller's 500 components may be located remotely from other controller 500 components, such as in a distributed system. Furthermore, one or more of the components may be combined and additional components performing functions described herein may be included in the controller 500. Thus, the controller 500 can be adapted to accommodate a variety of needs and circumstances. For example, though described as a single computing entity, the controller 30 may be a distributed system and/or comprise multiple computing entities, in an example embodiment. For example, in one example embodiment, a controller 500 may comprise a server and custom built hardware components configured for driving and/or controlling the operation of the one or more qubit management systems 550.

Conclusion

Many modifications and other embodiments of the invention set forth herein will come to mind to one skilled in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A method comprising:
receiving, by a controller of a quantum computer comprising qubit management systems and a plurality of physical qubits, a quantum circuit comprising a plurality of circuit slices, wherein a first slice of the plurality of circuit slices comprises a past causal cone of a first system qubit wire at a fully evolved level of the quantum circuit, and an i-th slice of the plurality of circuit slices is defined to contain all gates that are not within a past causal cone of any system qubit wire of the quantum circuit that reaches the fully evolved level of the quantum circuit in slice i−j, where $0 \leq j < i$ is an integer, but that can now be executed by initiating one or more physical qubits that have reached the fully evolved level during execution of slice i−1, have optionally been measured, and reset onto the system qubit wires in a base level of slice i;

causing, by the controller, execution of the i-th slice of the quantum circuit using the physical qubits of the quantum computer;

causing, by the controller, a physical qubit that was evolved as the system qubit fully evolved via execution of the i-th slice to be optionally measured, and reinitialized and reintroduced onto a system qubit wire at a base level of the i+m-th slice, m a positive integer; and causing, by the controller, the quantum computer to use the physical qubit to execute the i+m-th slice of the quantum circuit.

2. The method of claim 1, wherein executing the i-th slice of the quantum circuit comprises executing all gates for which incoming and outgoing wires lie within the i-th slice in order to propagate the system qubits forward in time.

3. The method of claim 2, wherein the quantum circuit comprises at least one ancilla wire and executing the i-th slice of the quantum circuit comprises interacting one or more system qubits at a bottom of the i-th slice with at least one ancilla qubit via unitary gates in order to introduce initial correlations between the one or more system qubits at the bottom of the i-th slice and system qubits at the bottom of one or more other slices.

4. The method of claim 1, wherein the quantum circuit encodes interactions governed by a Hamiltonian characterized by local interactions.

5. The method of claim 1, wherein each system qubit wire corresponds to a degree of freedom associated with a section of a physical domain being simulated.

6. The method of claim 5, wherein executing the i-th slice of the quantum circuit comprises evolving the degree of freedom in accordance with an operator.

7. The method of claim 6, wherein the operator is a Hamiltonian.

8. The method of claim 5, wherein the physical domain is one of a one dimensional, two dimensional, or three dimensional physical domain.

9. The method of claim 5, wherein the quantum circuit simulates the dynamics of the evolution of quantum states defined on a lattice representing the physical domain.

10. The method of claim 1, further comprising performing one or more measurements of at least one physical qubit of the plurality of qubits to determine a value corresponding to at least one degree of freedom within the physical domain.

11. The method of claim 1, wherein at least one system qubit wire of the quantum circuit extends through multiple slices of quantum circuit.

12. A computing entity in communication with a controller of a quantum computer comprising qubit management systems and a plurality of physical qubits, the computing entity configured to cause the controller to control elements of the quantum computer to:

receive, by the controller, a quantum circuit comprising a plurality of circuit slices, wherein a first slice of the plurality of circuit slices comprises a past causal cone of a first system qubit wire at a fully evolved level of the quantum circuit, and an i-th slice of the plurality of circuit slices is defined to contain all gates that are not within a past causal cone of any system qubit wires of the quantum circuit that reach the fully evolved level of the quantum circuit in slice i−j, where $0 \leq j < i$ is an integer, but that can now be executed by initiating one or more physical qubits that have reached the fully evolved level during execution of slice i−1, have optionally been measured, and reset onto the system qubit wires in a base level of slice i;

cause the quantum computer to execute of the i-th slice of the quantum circuit using the physical qubits;

cause the quantum computer to initialize a physical qubit, which was evolved along at least one system qubit wire to be fully evolved via execution of the i-th slice, onto a system qubit wire at a base level of the i+m-th slice of the quantum circuit, m a positive integer; and cause the quantum computer to use the physical qubit to execute the i+m-th slice of the quantum circuit.

13. The computing entity of claim 12, wherein executing the i-th slice of the quantum circuit comprises executing all gates for which incoming and outgoing wires lie within the i-th slice in order to propagate the system qubits forward in time.

14. The computing entity of claim 13, wherein the quantum circuit comprises at least one ancilla wire and executing the i-th slice of the quantum circuit comprises interacting one or more system qubits at a bottom of the i-th slice with at least one ancilla qubit via unitary gates in order to introduce initial correlations between the one or more system qubits at the bottom of the i-th slice and system qubits at the bottom of one or more other slices.

15. The computing entity of claim 12, wherein (a) the quantum circuit encodes interactions governed by a Hamiltonian characterized by local interactions and (b) each system qubit wire corresponds to a degree of freedom associated with a section of a physical domain being simulated.

16. The computing entity of claim 15, wherein the quantum circuit simulates the dynamics of the evolution of quantum states defined on a lattice representing the physical domain.

17. The computing entity of claim 15, wherein executing the i-th slice of the quantum circuit comprises evolving the degree of freedom in accordance with the Hamiltonian.

18. The computing entity of claim 15, wherein the physical domain is one of a one dimensional, two dimensional, or three dimensional physical domain.

19. The computing entity of claim 12, wherein the computing entity is further configured to cause the controller to control elements of the quantum computer to perform one or more measurements of at least one physical qubit of the plurality of qubits to determine a value of at least one degree of freedom within the physical domain.

20. The computing entity of claim 12, wherein at least one system qubit wire of the quantum circuit extends through multiple slices of quantum circuit.

* * * * *